United States Patent
Kaneki et al.

(10) Patent No.: US 6,388,502 B2
(45) Date of Patent: May 14, 2002

(54) SEMICONDUCTOR INTEGRATED CIRCUIT

(75) Inventors: Kazuo Kaneki; Takahiro Miki, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/756,215

(22) Filed: Jan. 9, 2001

(30) Foreign Application Priority Data

Jul. 27, 2000 (JP) .......................................... 2000-227736

(51) Int. Cl.$^7$ ................................................ G06F 7/44
(52) U.S. Cl. ......................... 327/359; 327/355; 455/326
(58) Field of Search ................................ 327/355, 356, 327/357, 358, 359, 113; 330/254; 455/118, 189.1, 190.1, 230, 232.1, 234.1, 293, 326, 333, 334

(56) References Cited

U.S. PATENT DOCUMENTS

| | | | |
|---|---|---|---|
| 5,589,791 A | * 12/1996 | Gilbert ........................ | 327/359 |
| 5,995,819 A | * 11/1999 | Yamaji et al. .............. | 455/326 |
| 6,040,731 A | * 3/2000 | Chen et al. ................. | 327/359 |
| 6,043,710 A | * 3/2000 | Smith et al. ................ | 330/254 |
| 6,125,272 A | * 9/2000 | Bautista ...................... | 455/326 |

OTHER PUBLICATIONS

Gray et al., "Analysis and Design of Analog Integrated Circuits" (Third Edition), John Wiley & Sons, Inc., 1993, pp. 370–375 and 414–415.

* cited by examiner

*Primary Examiner*—Matthew Smith
*Assistant Examiner*—Paul Dinh
(74) *Attorney, Agent, or Firm*—Burns, Doane, Swecker & Mathis, LLP

(57) ABSTRACT

An output signal gain is improved by a semiconductor integrated circuit comprising a mixer circuit having an upper-stage transistor circuit to which a local signal is inputted and a lower-stage transistor circuit to which an RF signal is inputted, wherein a first resistance and a second resistance serving as a load are connected between the upper-stage transistor circuit and supply voltage, and a result of multiplication operation performed via the upper-stage transistor circuit and the lower-stage transistor circuit is made to appear as a first signal and a second signal at the first resistance and the second resistance respectively on the basis of the supply voltage; an emitter follower circuit including a first transistor and a second transistor for respectively receiving outputs from the first resistance and the second resistance and outputting a first amplified signal and a second amplified signal that have been subjected to impedance conversion on the basis of the supply voltage; and an operational amplifier circuit for receiving the first amplified signal on an inverting input side via an input resistance and the second amplified signal on a non-inverting input side, the operational amplifier circuit including a feedback resistance for connecting its output side and the inverting input side provided with the input resistance.

10 Claims, 9 Drawing Sheets

SEMICONDUCTOR INTEGRATED CIRCUIT

BACKGROUND OF THE INVENTION

1. Field of the Invention

The present invention relates to a semiconductor integrated circuit used for a receiving circuit of a wireless communication apparatus.

2. Description of the Related Art

In general, a receiving circuit of a wireless communication apparatus is characterized by converting a high-frequency and weak signal picked up by an antenna into a low-frequency signal and then amplifying it. The receiving circuit comprises an LNA (Low Noise Amplifier), a mixer, and a BPF (Band Pass Filter). The LNA is provided to amplify a weak signal so that the signal will not be buried in noise. The mixer is a circuit that performs frequency conversion. The BPF is used to eliminate an unnecessary signal component such as higher harmonics generated by the mixer or an amplifier, and a signal from an adjacent channel. In the following, description centering on this mixer will be made by taking an example.

FIG. 10 is a schematic configuration diagram showing a conventional semiconductor integrated circuit. In the figure, reference numeral 300 designates a Gilbert cell (see P. R. Gray, R. G. Meyer: Analysis and Design of Analog Integrated Circuits 3rd ed. (1993)) type mixer circuit, a LO signal designates a local signal, an RF signal designates a high-frequency signal, and Vout designates an output signal from the mixer circuit 300.

Next, the operation of the semiconductor integrated circuit will be described.

The mixer circuit 300 receives an RF signal inputted externally from an antenna or the like and an LO signal generated from within the apparatus, multiplies the RF signal and the LO signal together, and then outputs output signals Vout representing their sum and difference in a frequency range.

Since the conventional semiconductor integrated circuit is configured as described above, it has presented a problem in that an output signal gain is not sufficient when the mixer circuit is formed only by a Gilbert cell.

SUMMARY OF THE INVENTION

The present invention has been made to solve problems as described above. An object of the present invention is to provide a semiconductor integrated circuit that makes it possible to provide a sufficient gain for an output signal from a mixer circuit and also to extract only a differential component of signals inputted to the mixer circuit, that is, to provide a desirable CMRR (Common Mode Rejection Ratio).

Another object of the present invention is to provide a semiconductor integrated circuit that makes it possible to provide a sufficient gain for an output signal from a mixer circuit, and which is not affected by variations in supply voltage, produces little output distortion, and consumes less power.

According to a first aspect of the present invention, there is provided a semiconductor integrated circuit comprising: a mixer circuit having an upper-stage transistor circuit to which a signal serving as a reference for frequency conversion is inputted and a lower-stage transistor circuit to which another signal to be converted is inputted, wherein a first resistance and a second resistance serving as a load are connected between the upper-stage transistor circuit and supply voltage, and a result of operation on the two input signals performed via these transistor circuits is made to appear as a first signal and a second signal at the first resistance and the second resistance respectively on the basis of the supply voltage; an emitter follower circuit including a first transistor and a second transistor for respectively receiving the first signal and the second signal and outputting a first amplified signal and a second amplified signal that have been subjected to impedance conversion on the basis of the supply voltage; and an operational amplifier circuit for receiving the first amplified signal on an inverting input side via a first input resistance and the second amplified signal on a non-inverting input side via a second input resistance and amplifying these signals to output a result, the operational amplifier circuit including a first feedback resistance for connecting its output side and the inverting input side provided with the first input resistance, and a second feedback resistance for connecting a voltage source and the non-inverting input side provided with the second input resistance.

According to a second aspect of the present invention, there is provided a semiconductor integrated circuit comprising: a mixer circuit having an upper-stage transistor circuit to which a signal serving as a reference for frequency conversion is inputted and a lower-stage transistor circuit to which another signal to be converted is inputted, wherein a first resistance and a second resistance serving as a load are connected between the upper-stage transistor circuit and supply voltage, and a result of operation on the two input signals performed via these transistor circuits is made to appear as a first signal and a second signal at the first resistance and the second resistance respectively on the basis of the supply voltage; an emitter follower circuit including a first transistor and a second transistor for respectively receiving the first signal and the second signal and outputting a first amplified signal and a second amplified signal that have been subjected to impedance conversion on the basis of the supply voltage; and an operational amplifier circuit for receiving the first amplified signal on an inverting input side via an input resistance and the second amplified signal on a non-inverting input side and amplifying these signals to output a result, the operational amplifier circuit including a feedback resistance for connecting its output side and the inverting input side provided with the input resistance.

Here, a capacitance may be connected between the first resistance and the second resistance on the side of the upper-stage transistor circuit.

In addition, the voltage source may be connected to the supply voltage or a ground.

In addition, each of output sides of the first transistor and the second transistor included in the emitter follower circuit may be provided with a resistance for adjustment of output voltage.

Further, a tap resistance for adjustment of output voltage may be provided between the first and second resistances and the supply voltage.

Furthermore, the lower-stage transistor circuit may be constructed by two transistors, whose sizes are made variable.

Preferably, the mixer circuit is of a Gilbert cell type.

DETAILED DESCRIPTION OF THE PREFERRED EMBODIMENTS

An embodiment of the present invention will be described below.

First Embodiment

Figure 1:
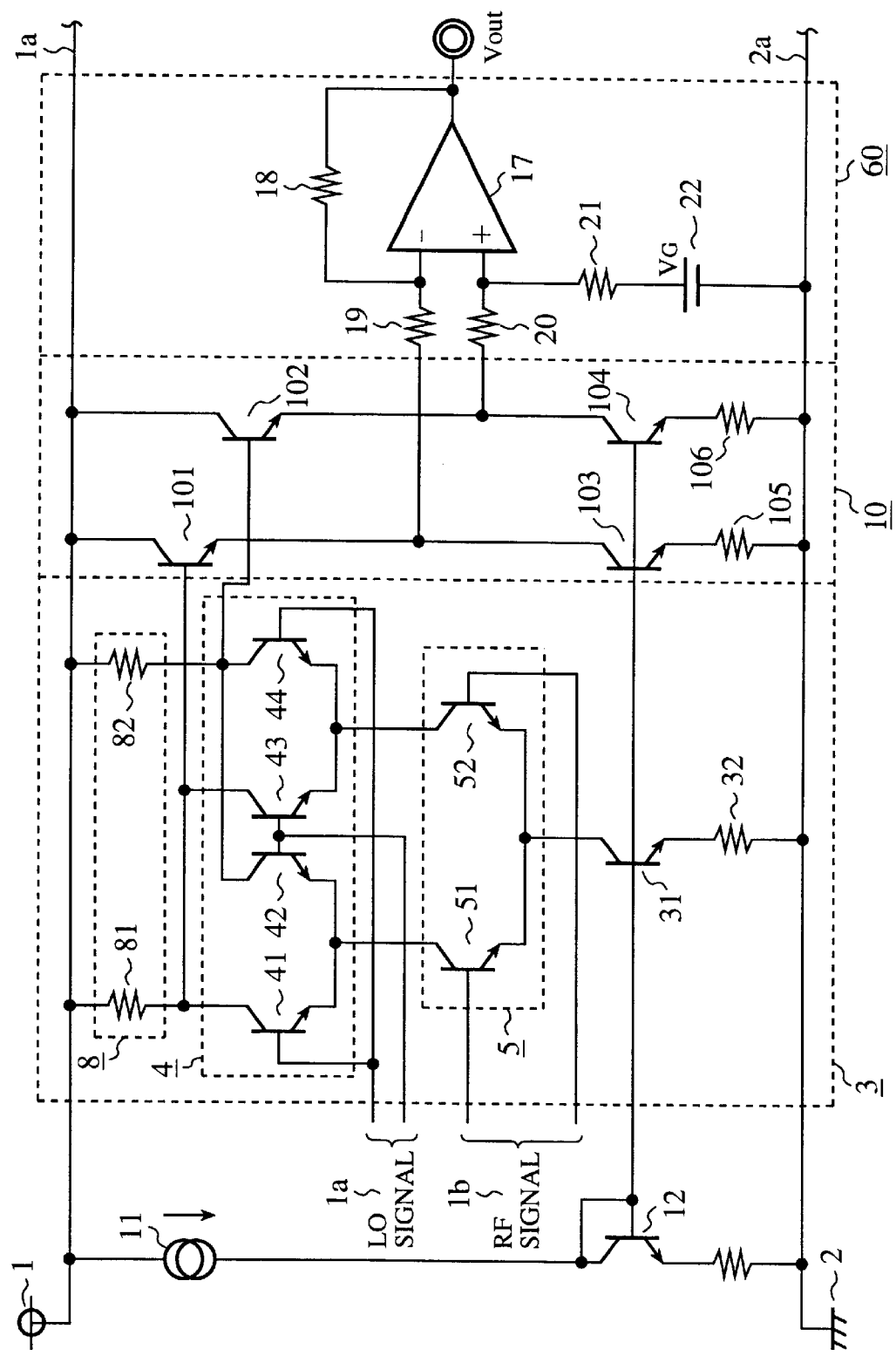
FIG. 1 is a circuit diagram showing a semiconductor integrated circuit according to a first embodiment of the present invention.

FIG. 1 is a circuit diagram showing a semiconductor integrated circuit according to a first embodiment of the present invention. In FIG. 1, reference numeral 1 designates a main power supply that supplies supply voltage Vcc; 1a designates a power supply line connected to the main power supply 1; 2 designates a ground; 2a designates a ground line connected to the ground 2; 11 designates a current source; and 12 designates an NPN bipolar transistor.

Figure 2:
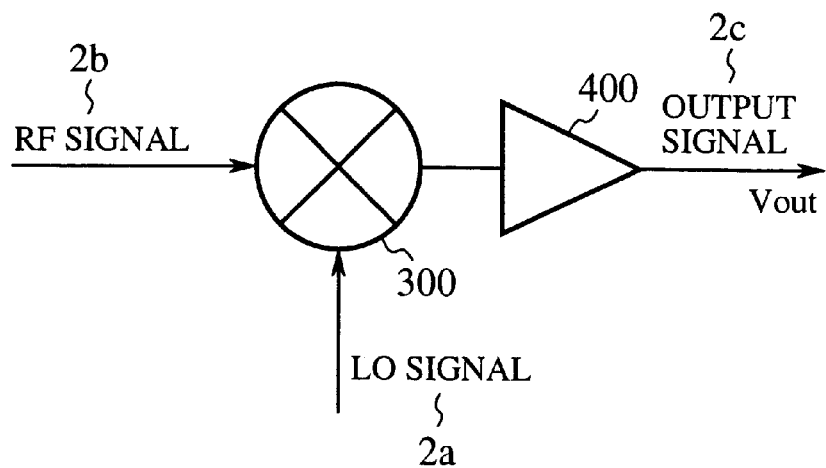
FIG. 2 is a schematic configuration diagram showing the semiconductor integrated circuit of FIG. 1.
Figure 10:
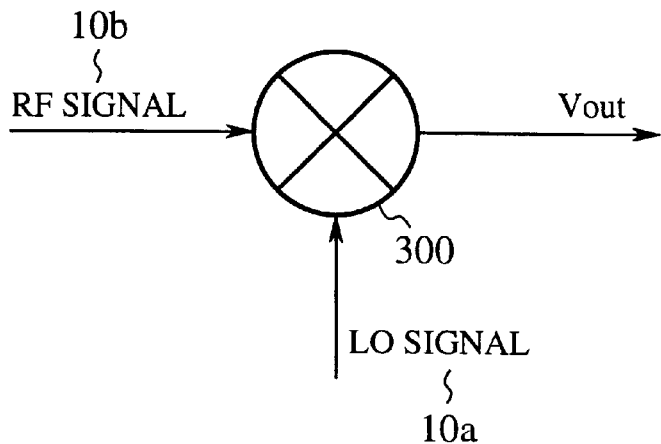
FIG. 10 is a schematic configuration diagram showing a conventional semiconductor integrated circuit.

In addition, FIG. 2 is a schematic configuration diagram showing the semiconductor integrated circuit of FIG. 1. In FIG. 2, reference numeral 300 designates a mixer circuit; 400 designates an amplifying means or amplifier, connected to the mixer circuit 300, for amplifying a frequency-converted output signal from the mixer circuit 300. The amplifier corresponds to a combination of an emitter follower circuit and an operational amplifier, which will be described later. FIG. 2 corresponds to the circuit configuration of FIG. 10 described in the section of prior art. The mixer circuit 300 is fed with a local signal serving as a reference for frequency conversion and a high-frequency RF signal to be subjected to frequency conversion. An output signal from the mixer circuit 300 is amplified via the amplifying means 400 and is then outputted as an output signal Vout.

Returning to the description of FIG. 1, reference numeral 3 designates a Gilbert cell type mixer circuit to perform frequency conversion; 4 designates an upper-stage transistor circuit of the mixer circuit 3 that performs on/off operations by receiving an input of a local signal or LO signal (a signal); 41 to 44 each designate an NPN bipolar transistor that forms the upper-stage transistor circuit 4; 5 designates a lower-stage transistor circuit of the mixer circuit 3 that receives an input of an RF (Radio Frequency) signal (another signal); 51 and 52 each designate an NPN bipolar transistor that forms the lower-stage transistor circuit 5; 8 designates a resistance circuit; 81 and 82 each designate a resistance that forms the resistance circuit 8; 31 designates an NPN bipolar transistor whose collector is connected to the emitter side of the lower-stage transistor circuit 5; and 32 designates a resistance interposed between the emitter of the transistor 31 and the ground 2.

In addition, reference numeral 10 designates an emitter follower circuit to connect the mixer circuit 3 at the previous stage with an operational amplifier 17 at the next stage; 101 to 104 each designate an NPN bipolar transistors that forms the emitter follower circuit; and 105 and 106 designate resistances located between the emitters of the transistors 103 and 104 and the ground line 2a, respectively. In this circuit, the transistors 103 and 104 each form a constant-current source.

Here, the emitter follower circuit 10 is a basic transistor amplifier circuit in which the potential of the collector is set to be a ground potential that is not varied in an alternating manner by an input signal, and therefore is also referred to as a grounded-collector amplifier circuit. A signal is inputted to the base of the emitter follower circuit and an output signal is extracted from the emitter. The voltage amplification factor of the emitter follower circuit is a value only slightly lower than unity or 1. However, the emitter follower circuit is characterized by an extremely high input impedance and a low output impedance. Because of these characteristics, the emitter follower circuit is used as a buffer circuit, a level shift circuit, and an impedance conversion circuit. In the present invention, the circuit 10 is used as an impedance converter circuit.

Further, reference numeral 17 designates an operational amplifier 17; 16 and 21 each designate a feedback resistance of the operational amplifier 17; 19 and 20 each designate an input resistance of the operational amplifier 17; and 22 designates a voltage source. These components construct an operational amplifier circuit 60 having a configuration of a differential amplifier.

Next, the operation of the semiconductor integrated circuit will be described with reference to FIG. 1.

The bases of the transistors 41 to 44 forming the upper-stage transistor circuit 4 of the mixer circuit 3 are fed with an LO signal serving as a reference for conversion. In the meantime, the bases of the transistors 51 and 52 forming the lower-stage transistor circuit 5 are fed with an RF signal to be converted. A product of the LO signal multiplied by the RF signal appears as a first signal and a second signal at the resistances 81 and 82 of the resistance circuit B serving as a load of the mixer circuit 3. These output signals are sent to the emitter follower circuit 10 to be converted into a first amplified signal and a second amplified signal by impedance conversion, and the converted signals are transmitted to the operational amplifier circuit 60 at the next stage.

Here, a gain of the operational amplifier 17 is as follows.

First, resistance values of the input resistance 19 and the input resistance 20 each are set to be R1; resistance values of the feedback resistance 18 and the feedback resistance 21 each are set to be R2; an emitter voltage of the transistor 101 constructing the emitter follower circuit 10 is set to be $V_-$; and an emitter voltage of the transistor 102 constructing the emitter follower circuit 10 is set to be $V_+$. Then, when a voltage value of the voltage source 22 is set to be $V_G$, an output Vout of the operational amplifier circuit 60 is given by the following equation (1).

$$\text{Vout} = R2/R1(V_+ - V_-) + V_G \tag{1}$$

That is, this indicates that in the output of the operational amplifier 17, the voltage $V_G$ of the voltage source 22 plays a central role, and the amplitude represents a gain of input differential voltage $(V_+ - V_-)$ multiplied by R2/R1.

Next, description will be made more specifically by applying numerical values.

When a voltage drop of the resistance circuit 8 is assumed to be about 200 mV, a base-to-emitter voltage (Vbe) of the transistor 101 is assumed about 700 mV, and a voltage of the supply voltage 1 is assumed Vcc, the emitter voltage of the transistors 101 and 102 is provided with Vcc−900 mV. In this case, when a supply voltage value of the voltage source 22 is set to be Vo, a current Ix flowing through the input resistance and the feedback resistance 21 is given by the following equation (2).

$$Ix=(Vcc-0.9-Vo)/(R1+R2) \quad (2)$$

In general, it is better that the current Ix have a low value. That is the reason if Ix forms a substantial proportion as compared with current values of the constant-current sources 103 and 104 of the emitter follower circuit 10, it results in a distorted waveform, that is, the linearity of the emitter follower is damaged. Of course, when Ix is large, the current value of the emitter follower circuit 10 may be increased accordingly. However, it is not preferable from a viewpoint of reduced current consumption.

Here, in order to estimate the value of the current Ix, the supply voltage Vcc and the voltage value Vo of the voltage source 22 are assumed to be 3 volts and 1.5 volts respectively, and R1+R2 is assumed to be 100 kilohms (kΩ). The reason for assuming R1+R2 to be 100 kilohms is as follows: In general, it is extremely difficult to provide a resistance of 100 kilohms or more as a resistance of an IC since it will result in an increase in layout area. Now, calculation after substituting the above values into the equation (2) results in a current Ix =6 μA. A value about ten times as high as this current value is assumed to be the current value of the emitter follower circuit 10 (60 μA).

Here, when the supply voltage Vcc is changed from 3 volts to 3.5 volts in order to consider variations in supply voltage Vcc, the current Ix becomes 11 μA, while when the supply voltage Vcc is changed to 4 volts, the current Ix becomes 16 μA. Thus, as the value of the supply voltage Vcc is changed, the value of the current Ix is also varied by a factor of two or more. In addition, since the current of the emitter follower circuit 10 is constant even when the current Ix is varied, the current value of the emitter follower circuit 10 needs to be set high in order to deal with variations in supply voltage Vcc.

Figure 3:
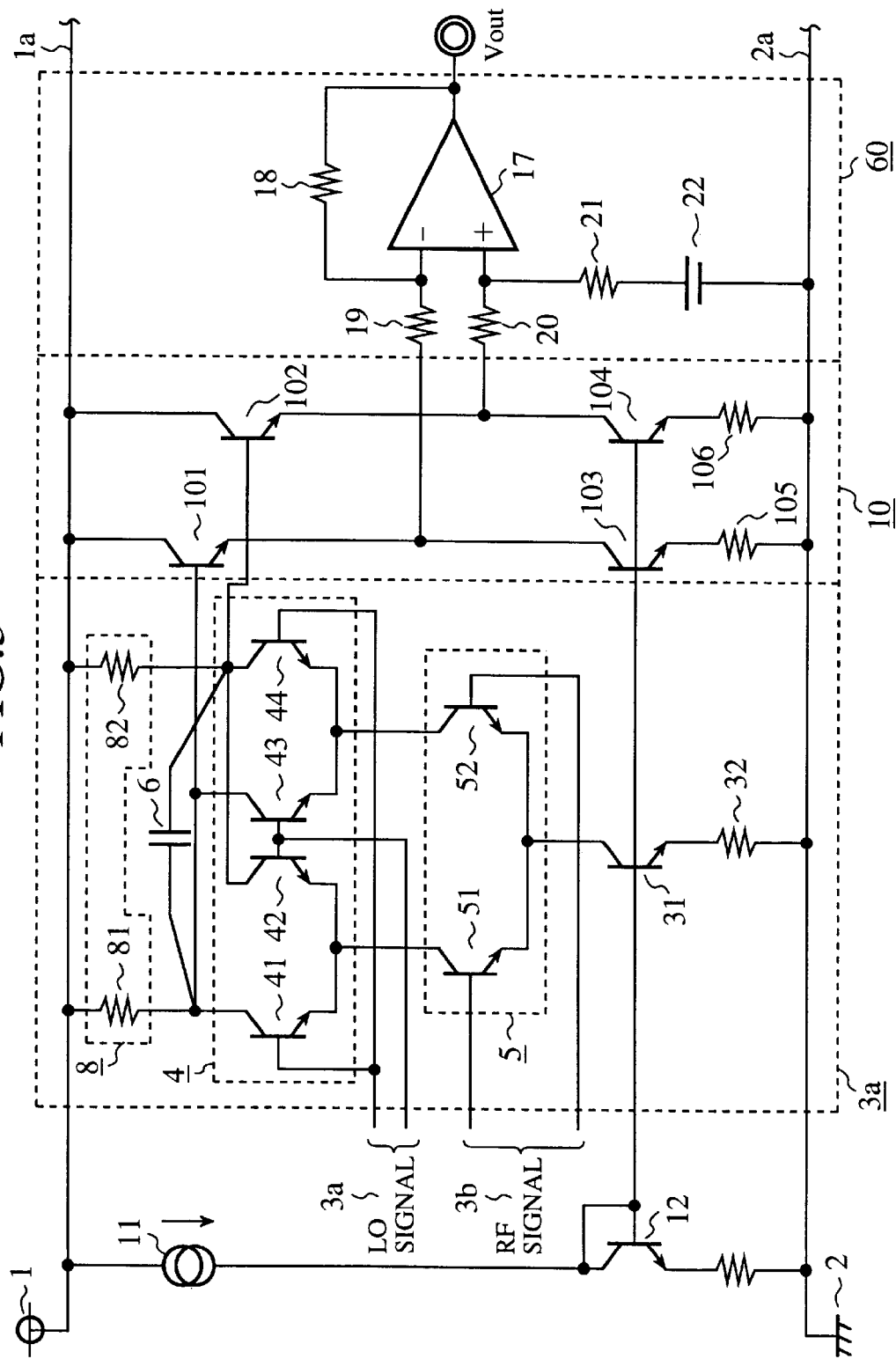
FIG. 3 is a circuit diagram showing a modification of the semiconductor integrated circuit according to the first embodiment of the present invention.

Next, a modification of the first embodiment will be considered. FIG. 3 is a circuit diagram showing a modification of the semiconductor integrated circuit according to the first embodiment of the present invention. The modification is characterized in that the collector sides of the transistors 41 and 44 forming the upper-stage transistor circuit 4 are connected to each other via a capacitance 6 to form a mixer circuit 3a.

Thus, when fr is set to be an RF signal component and fl is set to be a LO signal component, frequency components of the signals applied to the bases of the transistors 101 and 102 contained in the emitter follower circuit 10 are (fr−fl) and (fr+fl), respectively. Here, a signal that is actually needed is (fr−fl), and (fr+fl) is an unnecessary signal. However, if the unnecessary signal is inputted to the emitter follower circuit 10 and the operational amplifier 17, it results in an undesired amplified signal that will interfere even with the necessary signal component. Then, the capacitance 6 added to the resistance circuit 8, which serves as a load of the Gilbert cell in FIG. 3, removes the unnecessary fr+fl signal, and therefore it provides an effect of improving IIP3 characteristics, which serve as a linearity index.

As described above, according to the first embodiment, a sufficient gain is provided for an output signal from the mixer circuit 3, and also an effect of improving CMRR characteristics can be obtained because only a differential component of the signal is extracted and no in-phase component is outputted. Furthermore, when the mixer circuit 3a is formed by adding the capacitance 6 to the resistance circuit 8 serving as a load of the Gilbert cell, an unnecessary component, that is, a sum of the RF signal component and the LO signal component can be removed, thereby improving the linearity of the circuit.

Second Embodiment

Figure 4:
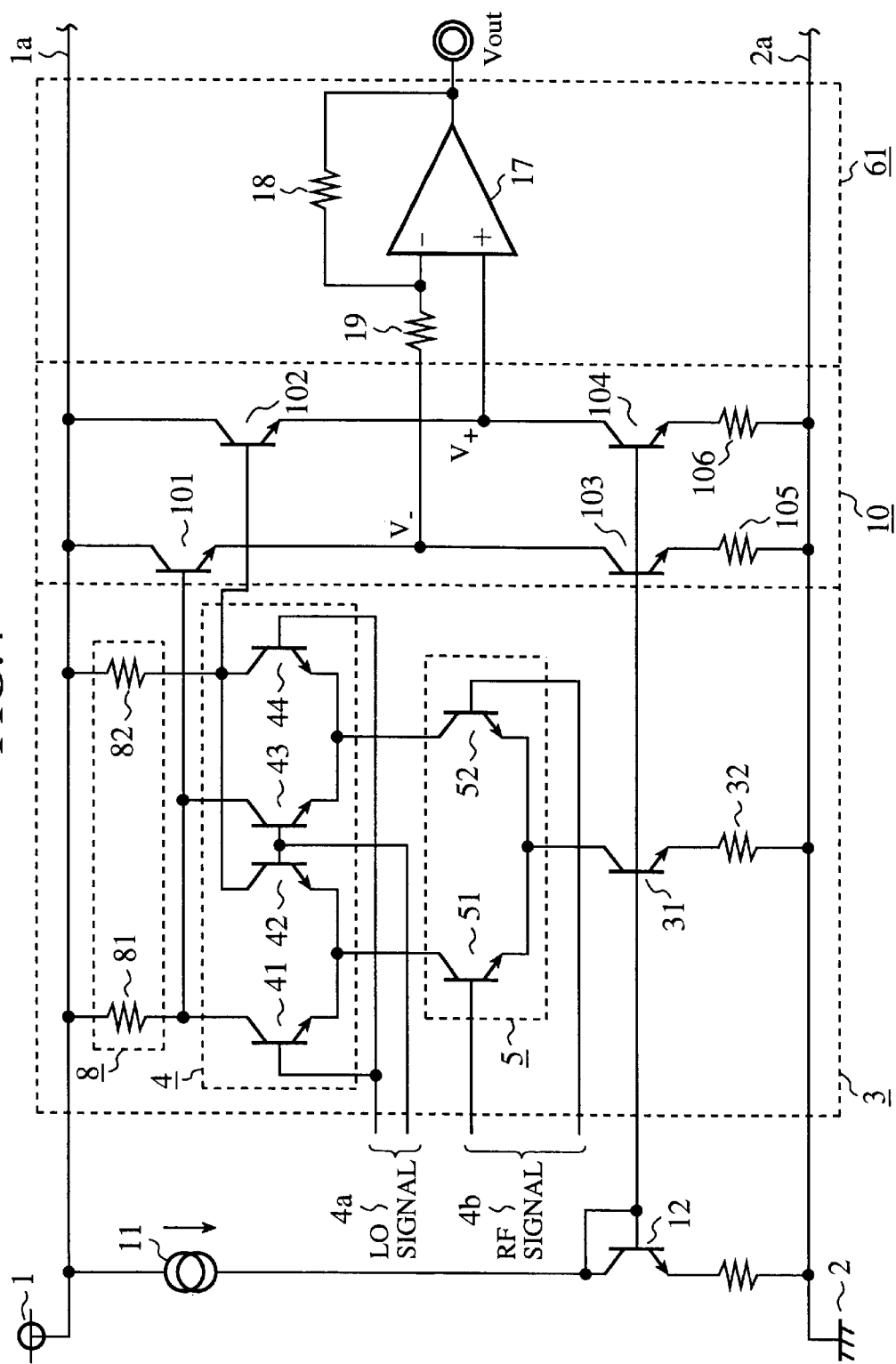
FIG. 4 is a circuit diagram showing a semiconductor integrated circuit according to a second embodiment of the present invention.

FIG. 4 is a circuit diagram showing a semiconductor integrated circuit according to a second embodiment of the present invention.

FIG. 4, reference numeral 1 designates a main power supply that supplies supply voltage Vcc; 1a designates a power supply line connected to the main power supply 1; 2 designates a ground; 2a designates a ground line connected to the ground 2; 11 designates a current source; and 12 designates a latch type NPN bipolar transistor.

In addition, reference numeral 3 designates a Gilbert cell type mixer circuit; 4 designates an upper-stage transistor circuit of the mixer circuit 3 that performs on/off operations by receiving an input of a local signal or a LO signal; 41 to 44 each designate an NPN bipolar transistors that forms the upper-stage transistor circuit 4; 5 designates a lower-stage transistor circuit of the mixer circuit 3 that receives an input of an RF signal; 51 and 52 each designate an NPN bipolar transistors that forms the lower-stage transistor circuit 5; 8 designates a resistance circuit; 81 and 82 each designate a resistance that forms the resistance circuit 8; 31 designates an NPN bipolar transistor of which the collector is connected to the emitter side of the lower-stage transistor circuit 5; and 32 designates a resistance located at a point intermediate between the emitter of the transistor 31 and the ground 2.

Moreover, reference numeral 10 designates an emitter follower circuit to connect the mixer circuit 3 in the previous stage with an operational amplifier 17 at the next stage; 101 to 104 each designate an NPN bipolar transistor that forms the emitter follower circuit; 105 and 106 designate resistance located between the emitters of the transistors 103 and 104 and the ground line 2a, respectively. In this circuit, the transistors 103 and 104 form constant-current sources.

Furthermore, reference numeral 17 designates an operational amplifier; 18 designates a feedback resistance that connects the output of the operational amplifier 17 with its inverting input side, that is, its negative side; and 19 designates an input resistance on the inverting input side of the operational amplifier 17. These components construct an operational amplifier circuit 61. The two inputs of the operational amplifier circuit 61 are respectively taken from the emitters of the output transistor 101 and the transistor 102 of the emitter follower circuit 10.

Next, the operation of the semiconductor integrated circuit will be described.

When it is assumed-that an emitter potential of the transistor 102 included in the emitter follower circuit 10 is $V_+$, an emitter potential of the transistor 101 is $V_-$, a resistance value of the input resistance 19 is R1 and a resistance value of the feedback resistance 18 is R2, an output voltage Vout of the operational amplifier 17 is given by the following equation (3).

$$Vout=V_+-R2/R1(V_--V_+) \quad (3)$$

As an example of the case where $V_+$ and $V_-$ are solely differential inputs, $V_+$ and $V_-$ are expressed as the following equations (4) and (5) respectively by using trigonometric functions.

$$V_+ = A\sin\omega t \quad (4)$$

$$V_- = A\sin\omega t \quad (5)$$

In this case, Vout is given by the following equation (6), and therefore an amplified signal is obtained.

$$V_{out} = (1+2R2/R1) A\sin\omega t \quad (6)$$

It should be noted that in the second embodiment, a voltage source 22 as shown in FIG. 1 is not required. In addition, a current Iy flowing from the emitter follower circuit 10 to the operational amplifier 17 is given by the following equation (7).

$$Iy = (V_- - V_+)/R1 \quad (7)$$

Thus, the dependence of the current Iy on supply voltage is eliminated, and a current in proportion to a voltage difference ($V_- - V_+$) between differential inputs flows at all times. Because the voltage difference is extremely small, however, the current value of the current Iy is so low as to be negligible, and besides the current Iy is not dependent on supply voltage.

Figure 5:
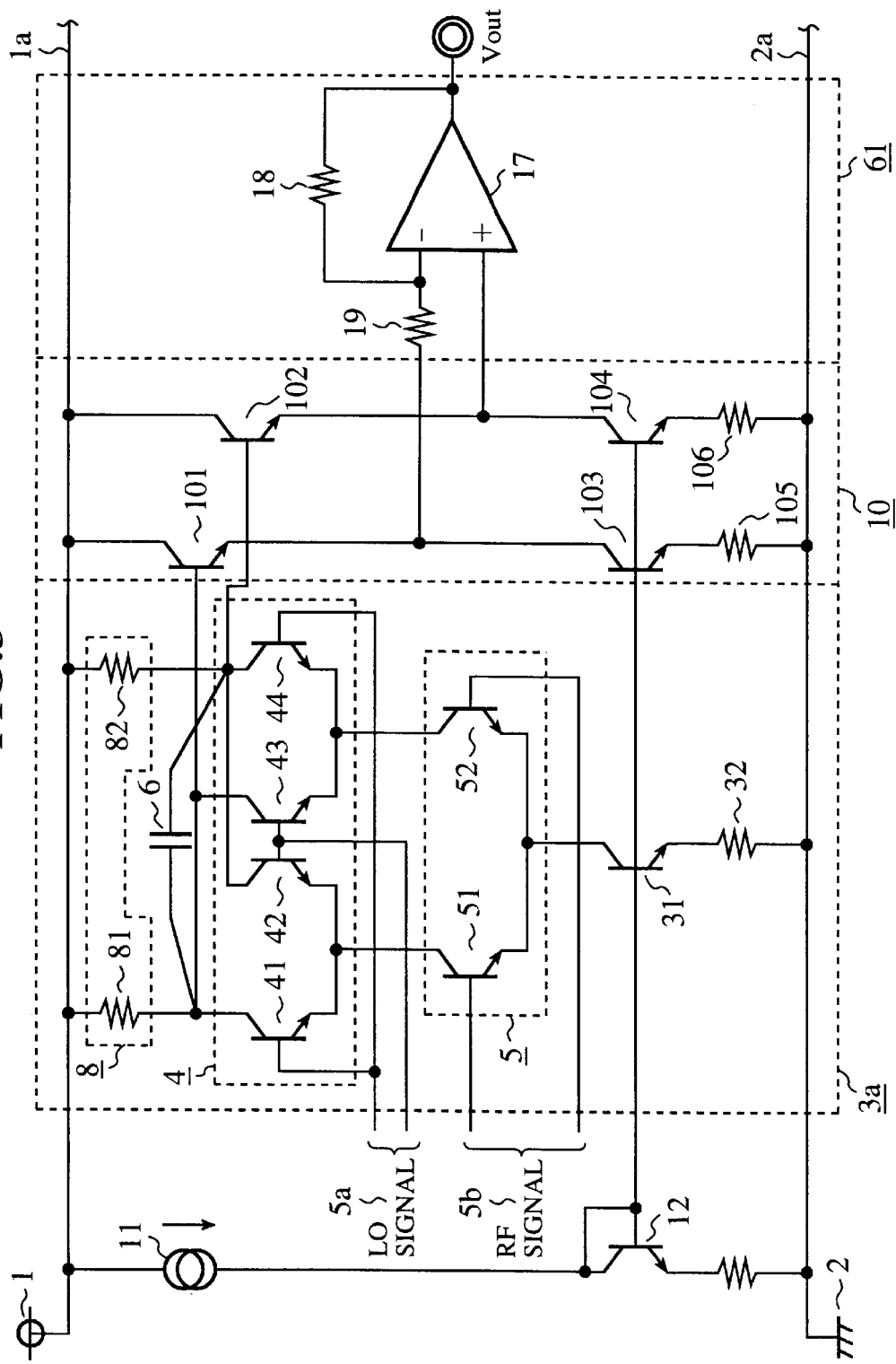
FIG. 5 is a circuit diagram showing a modification of the semiconductor integrated circuit according to the second embodiment of the present invention.

Next, a modification of the second embodiment will be considered. FIG. 5 is a circuit diagram showing a modification of the semiconductor integrated circuit according to the second embodiment of the present invention. Similarly to FIG. 3, the modification is configured in such a way that the collectors of the transistors 41 and 44 forming the upper-stage transistor circuit 4 are connected to each other via a capacitance 6.

Thus, when fr is set to be an RF signal component and fl is set to be a LO signal component, frequency components of the signals applied to the bases of the transistors 101 and 102 contained in the emitter follower circuit 10 are (fr−fl) and (fr+fl), respectively. Here, a signal that is actually needed is (fr−fl), and (fr+fl) is an unnecessary signal. However, if the unnecessary signal is inputted to the emitter follower circuit 10 and the operational amplifier 17, it results in an undesired amplified signal that will interfere even with the necessary signal component.

When the capacitance 6 is added to a load of the Gilbert cell in FIG. 5, that is, the resistance circuit 8 to form a mixer circuit 3a, the unnecessary fr+fl signal is removed. Therefore, an effect of improving linearity index IIP3 characteristics can be obtained.

As described above, according to the second embodiment, it is possible to provide a sufficient gain for an output signal from the mixer circuit 3. Besides, the semiconductor integrated circuit according to the second embodiment is not affected by variations in supply voltage, and also controls output distortion to a low level. Moreover, since the voltage source 22 that is required in the above-mentioned first embodiment is omitted, an effect of reducing power consumption, which increases with the scale of the circuit, can be obtained. In addition, when the mixer circuit 3a is formed by adding the capacitance 6 to the resistance circuit 8 serving as a load of the Gilbert cell, it is possible to remove an unnecessary component, that is, a sum of the RF signal component and the LO signal component, thereby improving the linearity of the semiconductor integrated circuit.

Third Embodiment.

Figure 6:
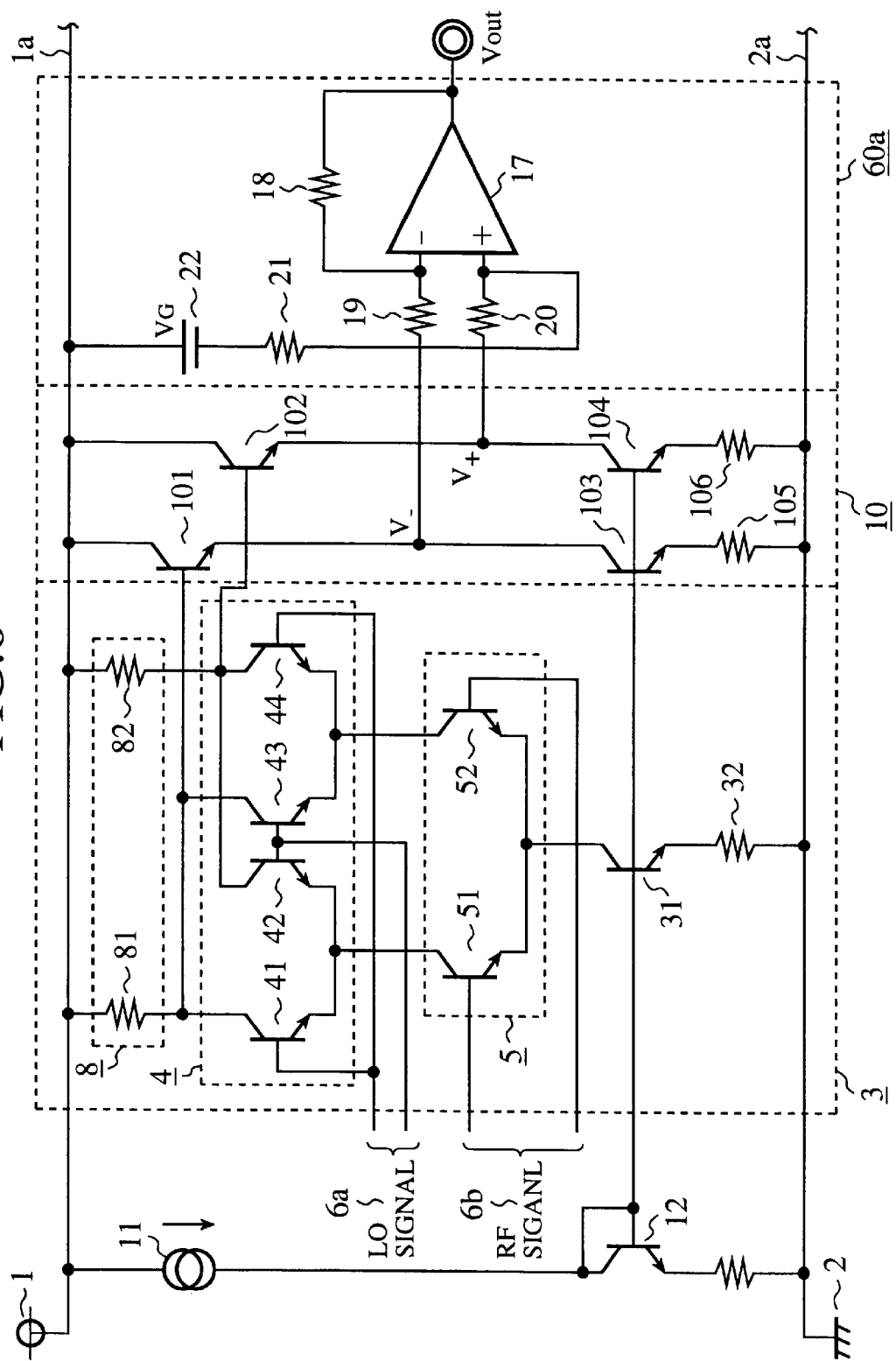
FIG. 6 is a circuit diagram showing a semiconductor integrated circuit according to a third embodiment of the present invention.

FIG. 6 is a circuit diagram showing a semiconductor integrated circuit according to a third embodiment of the present invention. In FIG. 6, reference numeral 3 designates a Gilbert cell type mixer circuit; 10 designates an emitter follower circuit; and 60a designates an operational amplifier circuit having a configuration of a differential amplifier. Incidentally, the same reference numerals as used in the above description designate the same parts or corresponding parts. Therefore, their description is omitted, and will similarly be omitted in the following description.

The semiconductor integrated circuit according to the third embodiment comprises a mixer circuit 3, an operational amplifier 17 for performing differential amplification, and an emitter follower circuit 10 for connecting the mixer circuit 3 with the operational amplifier 17. It should be noted that the semiconductor integrated circuit according to the third embodiment is similar to the semiconductor integrated circuit according to the first embodiment described above in that the operational amplifier circuit 60a has a configuration of a differential amplifier; however, it is of a different configuration than in the first embodiment in that a voltage source 22 is connected to the power supply side, not to the ground side.

Next, the operation of the semiconductor integrated circuit will be described.

The bases of transistors 41 to 44 forming an upper-stage transistor circuit 4 of the mixer circuit 3 are fed with an LO signal serving as a reference for conversion. The bases of transistors 51 and 52 forming a lower-stage transistor circuit 5 are fed with an RF signal to be converted. A product of the LO signal multiplied by the RF signal appears as a first signal and a second signal at resistances 81 and 82 of a resistance circuit 8 serving as a load of the mixer circuit 3. These outputs are sent to the emitter follower circuit 10 to be converted into a first amplified signal and a second amplified signal by impedance conversion, and the converted signals are transmitted to the differential amplifier 60a.

Here, a gain of the operational amplifier 17 is as follows.

First, resistance values of an input resistance 19 and an input resistance 20 are set to be R1; resistance values of a feedback resistance 18 and a feedback resistance 21 are set to be R2; an emitter voltage of a transistor 101 forming the emitter follower circuit 10 is set to be $V_-$; and an emitter voltage of a transistor 102 forming the emitter follower circuit 10 is set to be $V_+$. Then, when a voltage value of the voltage source 22 is set to be $V_G$, an output Vout of the operational amplifier 17 is given by the following equation (1a).

$$V_{out} = R2/R1(V_+ - V_-) + V_{cc} - V_G \quad (1a)$$

In the output of the operational amplifier 17, $V_{cc} - V_G$ plays a central role, and the amplitude represents a gain of input differential voltage ($V_+ - V_-$) multiplied by R2/R1.

Here, when consideration is given to a case where the voltage source 22 is connected to a power supply line 1a extending from a main power supply 1, not to a ground line 2a, the equation (2) is modified into the following equation (8).

$$Ix = (V_o - 0.9)/(R1 + R2) \quad (8)$$

The equation (8) is different from the equation (2) in that the equation (8) is not dependent on supply voltage Vcc.

Thus, when a current flowing from the emitter follower circuit 10 to the operational amplifier 17 is not dependent on supply voltage Vcc, the circuit characteristics of the semiconductor integrated circuit are not affected much by variations in supply voltage. This means that it is not necessary to consider the problem that the value of the current Ix is varied with change in the value of supply voltage Vcc, nor to consider the necessity of setting the current value of the emitter follower circuit 10 at a high level in order to deal with variations in the supply voltage Vcc.

As described above, according to the third embodiment, a sufficient gain may be provided for an output signal from the mixer circuit 3, similarly to the first embodiment described above, and also improved CMRR characteristics may be obtained because only a differential component of the signal is extracted and no in-phase component is outputted. Furthermore, the current flowing from the emitter follower circuit 10 to the operational amplifier 17 is not dependent on supply voltage Vcc, and therefore the circuit characteristics of the semiconductor integrated circuit as a whole are not affected much by variations in supply voltage Vcc.

Fourth Embodiment

Figure 7:
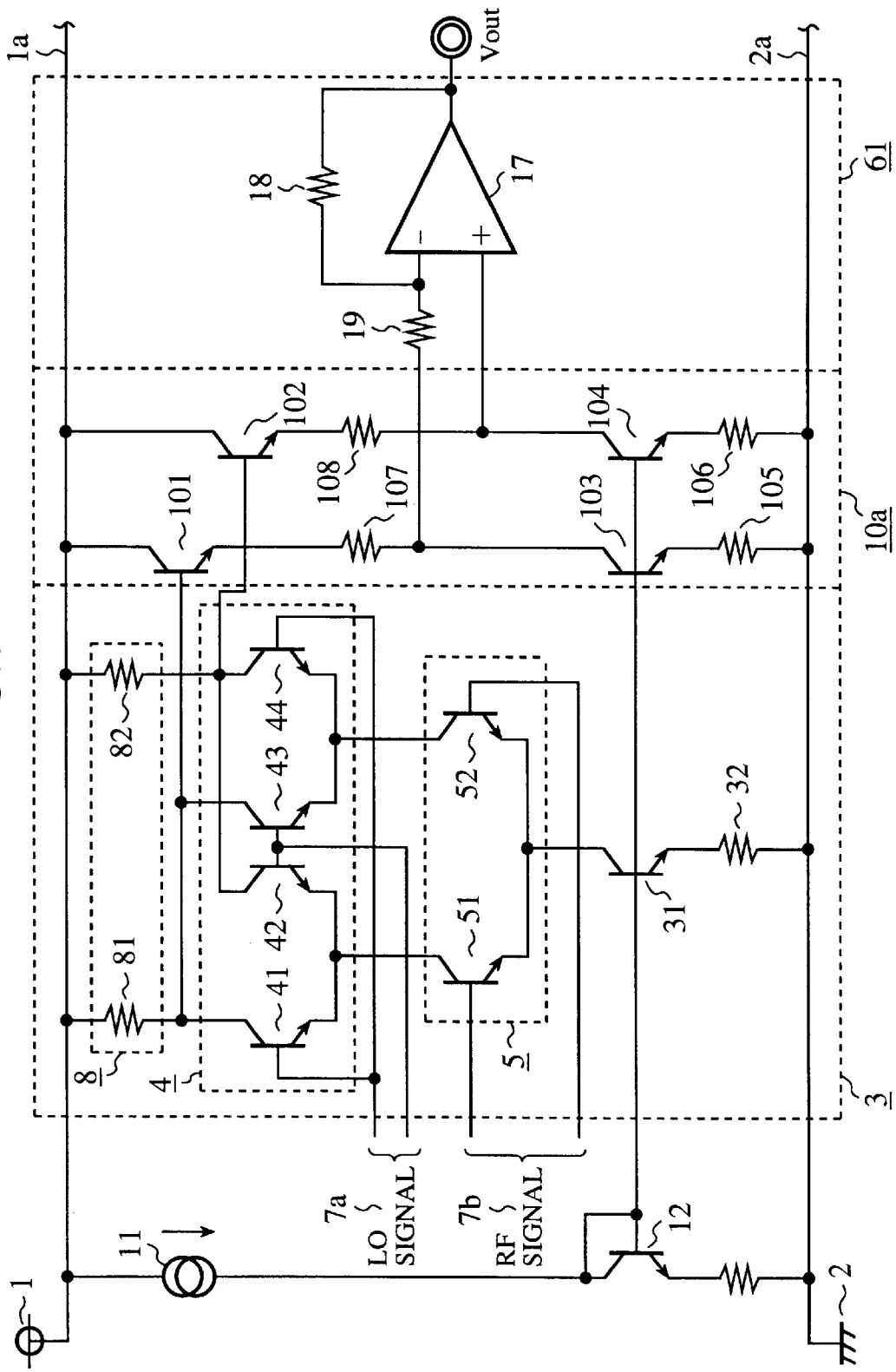
FIG. 7 is a circuit diagram showing a semiconductor integrated circuit according to a fourth embodiment of the present invention.

FIG. 7 is a circuit diagram showing a semiconductor integrated circuit according to a fourth embodiment of the present invention. In FIG. 7, reference numeral 3a Gilbert cell type mixer circuit; 10a designates an emitter follower circuit; and 61 designates an operational amplifier circuit having an operational amplifier 17 provided with a feedback resistance 18 and an input resistance 19 for its negative side input. Incidentally, the same reference numerals as used In the above description designate the same parts or corresponding parts. Therefore, their description is omitted, and will similarly be omitted in the following description.

Now, in the case of the semiconductor integrated circuit according to the second embodiment as shown in FIG. 4, the voltage Vout outputted by the operational amplifier 17 is substantially determined by $V_+$, as indicated by the equation (3). Thus, an example of a means to be taken when the output voltage Vout is to be tuned is a semiconductor integrated circuit of FIG. 7 according to the fourth embodiment. The semiconductor integrated circuit is characterized in that resistances 107 and 108 are respectively added to the emitter sides of transistors 101 and 102 in the emitter follower circuit 10 as described above.

Next, the operation of the semiconductor integrated circuit will be described.

A first signal and a second signal that have appeared at a resistance circuit 8 of the mixer circuit 3 as a result of multiplication are next inputted to the bases of transistors 101 and 102 of the emitter follower circuit 10a. On the basis of supply voltage Vcc, the signals are converted into a first amplified signal and a second amplified signal via the resistances 107 and 108 connected to the emitters of the transistors 101 and 102 respectively. The resulting signals form output voltages $V_+$ and $V_-$ to be inputted to the operational amplifier 17 at the next stage. More specifically, by adjusting resistance values of the resistances 107 and 108, it is possible to lower the emitter potential $V_+$ of the transistor 102 and the emitter potential $V_-$ of the transistor 101.

It should be noted that an output of the operational amplifier 17 is also an output of the operational amplifier circuit 61, and its output voltage Vout is determined by the emitter voltage $V_+$ of the transistor 102, which forms the emitter follower circuit 10a. Therefore, the output voltage Vout can be adjusted by controlling the resistance values of the resistances 107 and 109 In such a way that a DC output voltage Vout of the operational amplifier 17 becomes exactly half the supply voltage Vcc. In this way, the dynamic range of the output voltage Vout from the operational amplifier 17 can be maximized.

As described above, according to the fourth embodiment, it is possible to make adjustment in such away that the DC output voltage Vout of the operational amplifier 17 or the operational amplifier circuit 61 becomes exactly half the supply voltage Vcc, by controlling the resistances 107 and 108 added to the emitter sides of the transistors 101 and 102 of the emitter follower circuit 10a, thereby maximizing the dynamic range of the output voltage Vout from the operational amplifier circuit 61, and hence from the semiconductor integrated circuit including the mixer circuit 3.

Fifth Embodiment

Figure 8:
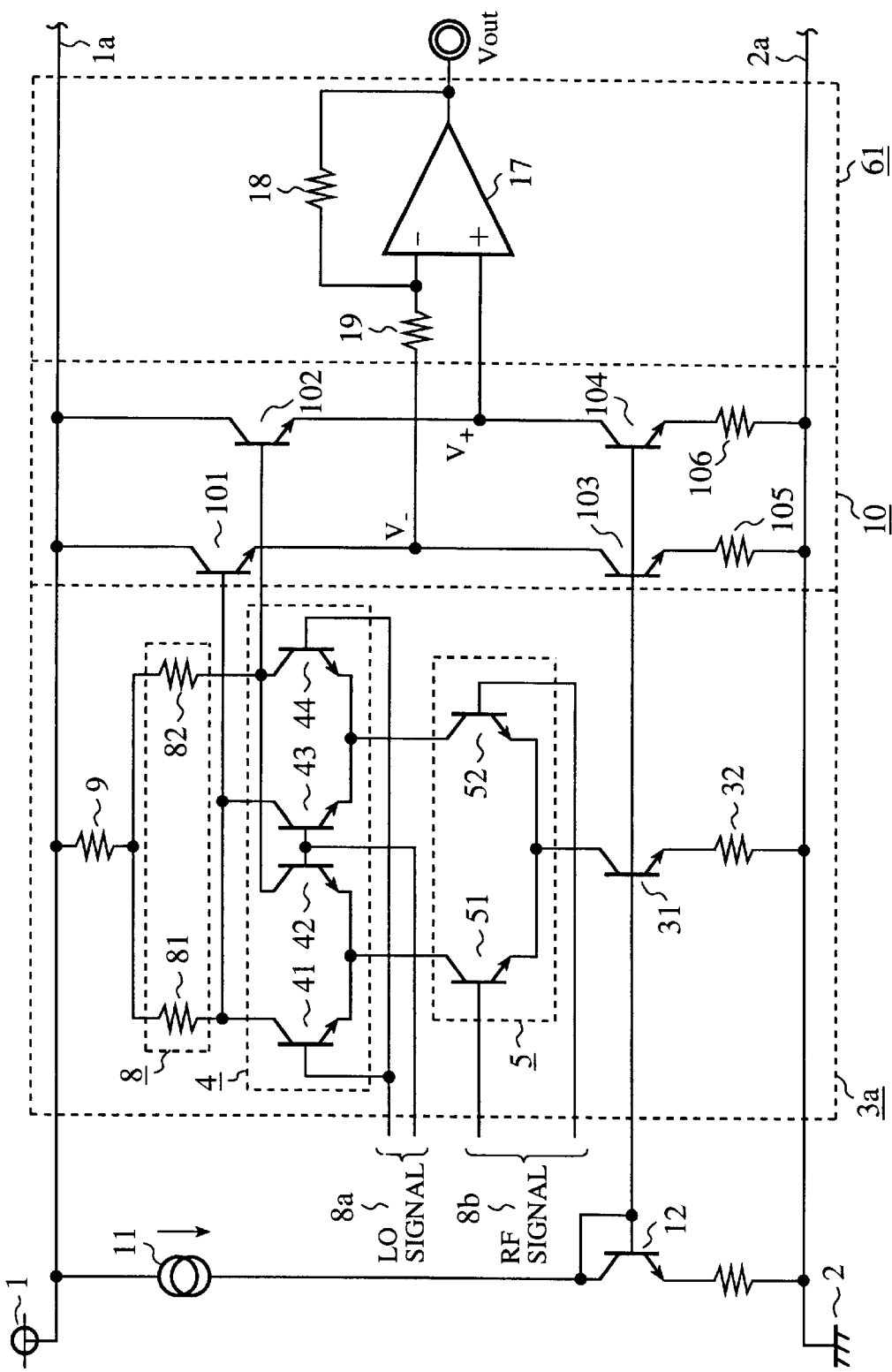
FIG. 8 is a circuit diagram showing a semiconductor integrated circuit according to a fifth embodiment of the present invention.

FIG. 8 is a circuit diagram showing a semiconductor integrated circuit according to a fifth embodiment of the present invention. In FIG. 8, reference numeral 3a designates a Gilbert cell type mixer circuit; 10 designates an emitter follower circuit, and 61 designates an operational amplifier circuit having an operational amplifier 17 which is provided with a feedback resistance 18 and an input resistance 19 on its negative side, that is, its inverting input side.

As described above, in the case of the semiconductor integrated circuit according to the second embodiment as shown in FIG. 4, the voltage Vout outputted by the operational amplifier 17 is substantially determined by $V_+$, as indicated by the equation (3). Thus, another example of a means to be taken when the output voltage Vout is to be tuned is a semiconductor integrated circuit of FIG. 8 according to the fifth embodiment. The semiconductor integrated circuit is characterized in that a tap resistance 9 is provided between a resistance circuit 8 serving as a load of the mixer circuit 3a as described above and a power supply line 1a.

Next, the operation of the semiconductor integrated circuit will be described.

A first signal and a second signal that have appeared as a result of multiplication at resistances 81 and 82 forming the resistance circuit 8 of the mixer circuit 3 can be adjusted by the added tap resistance 9. This adjustment is performed to control an emitter voltage $V_-$ of a transistor 101, which voltage is one of the output voltages of the emitter follower circuit 10. This is utilized to make adjustment in such a way that a DC output voltage Vout of the operational amplifier 17 becomes exactly half the supply voltage Vcc. In this way, the dynamic range of the output voltage Vout from the operational amplifier 17 can be maximized.

As described above, according to the fifth embodiment, a tap resistance 9 for the resistance circuit 8 of the mixer circuit 3a is provided, and therefore by controlling the tap resistance 9, it is possible to make adjustment in such a way that the DC output voltage Vout of the operational amplifier 17 or the operational amplifier circuit 61 becomes exactly half the supply voltage Vcc, thereby maximizing the dynamic range of the output voltage Vout from the operational amplifier circuit 61, and hence from the semiconductor integrated circuit.

Sixth Embodiment

Figure 9:
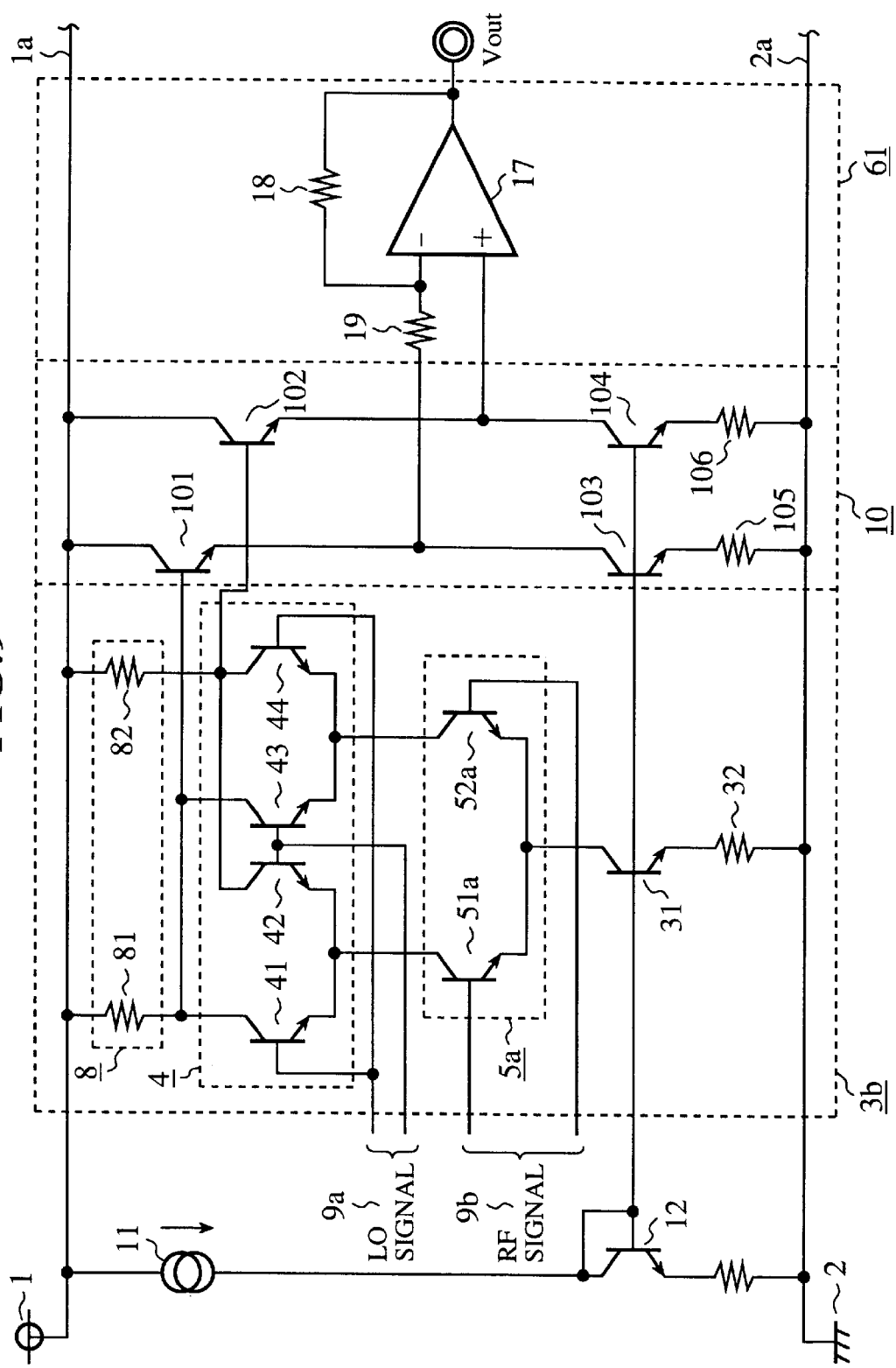
FIG. 9 is a circuit diagram showing a semiconductor integrated circuit according to a sixth embodiment of the present invention.

FIG. 9 is a circuit diagram showing a semiconductor integrated circuit according to a sixth embodiment of the present invention. In FIG. 9, reference numeral 3b designates a Gilbert cell type mixer circuit; 10 designates an emitter follower circuit; and 61 designates an input operational amplifier circuit having an operational amplifier 17 provided with a feedback resistance 18 and an input resistance 19 for its negative side input.

In the case of the semiconductor integrated circuit according to the second embodiment as shown in FIG. 4, the voltage Vout outputted by the operational amplifier 17 is substantially determined by $V_+$, as indicated by the equation (3). Thus, an example of a means to be taken when the output voltage Vout is to be tuned is a semiconductor integrated circuit of FIG. 9 according to the sixth embodiment. The semiconductor integrated circuit is characterized in that a lower-stage transistor circuit 5a in the above-mentioned mixer circuit 3b is formed by two NPN bipolar transistors 51a and 52a.

Next, the operation of the semiconductor integrated circuit will be described.

In general, a base-to-emitter voltage Vbe of an NPN transistor is determined by the following equation (9):

$$Vbe = V_T \ln I_C / I_S \tag{9}$$

where $V_T$ is a voltage referred to as a thermal voltage and is about 26 mV, $I_C$ is a collector current, and $I_S$ is a saturation current and is a quantity that is in proportional relation with the emitter area of the transistor.

Here, it is assumed that a transistor area of the transistor 52a is k times as large as an emitter area of the transistor 51a. When it is also assumed that a base-to-emitter voltage and a collector current of the transistor 51a are Vbe1 and $I_{C1}$ respectively, and a base-to-emitter voltage and a collector current of the transistor 52a are Vbe2 and $I_{C3}$ respectively, the following equation (10) is obtained.

$$Vbe1 - Vbe2 = V_T \ln k I_{C1} / I_{C2} \tag{10}$$

When k=1 and the base-to-emitter voltages of the transistors 51a and 52a are equal to each other, the collector currents $I_{C1}$ and $I_{C2}$ of the transistors 51a and 52a are equal to each other. However, if k≠1, the collector currents $I_{C1}$ and $I_{C2}$ of the transistors 51a and 52a are not equal to each other even when the base-to-emitter voltages of the transistors 51a and 52a are equal to each other. When these currents are not equal to each other, an imbalance between output voltages of the emitter follower circuit 10 occurs. As a result, it is possible to adjust a DC output voltage Vout of the operational amplifier 17.

This is utilized to make adjustment in such a way that the DC output voltage Vout of the operational amplifier 17 becomes exactly half the supply voltage Vcc. In this way, the dynamic range of the output voltage Vout from the operational amplifier 17 can be maximized.

As described above, according to the sixth embodiment, by changing the transistor sizes of the transistors 51a and 52a, which form the lower-stage transistor circuit 5a of the mixer circuit 3b, it is possible to make adjustment in such a way that the DC output voltage Vout of the operational amplifier 17 or the operational amplifier circuit 61 becomes exactly half the supply voltage Vcc, thereby maximizing the dynamic range of the output voltage Vout from the operational amplifier circuit 61, and hence from the semiconductor integrated circuit.

What is claimed is:

1. A semiconductor integrated circuit comprising:
   a mixer circuit having an upper-stage transistor circuit to which a signal serving as a reference for frequency conversion is inputted and a lower-stage transistor circuit to which another signal to be converted is inputted, wherein a first resistance and a second resistance serving as a load are connected between said upper-stage transistor circuit and supply voltage, and a result of operation on said two signals performed via said upper-stage transistor circuit and said lower-stage transistor circuit is made to appear as a first signal and a second signal at said first resistance and said second resistance respectively on the basis of said supply voltage;
   an emitter follower circuit including a first transistor and a second transistor for respectively receiving the first signal and the second signal outputted from the mixer circuit and outputting a first amplified signal and a second amplified signal that have been subjected to impedance conversion on the basis of said supply voltage; and
   an operational amplifier circuit for receiving said first amplified signal on an inverting input side via a first input resistance and said second amplified signal on a non-inverting input side via a second input resistance and amplifying the signals to output a result, the operational amplifier circuit including a first feedback resistance for connecting its output side and the inverting input side provided with said first input resistance, and a second feedback resistance for connecting a voltage source and the non-inverting input side provided with said second input resistance.

2. A semiconductor integrated circuit according to claim 1, wherein a capacitance is connected between the first resistance and the second resistance on the side of the upper-stage transistor circuit.

3. A semiconductor integrated circuit according to claim 1, wherein a voltage source is connected to the supply voltage or a ground.

4. A semiconductor integrated circuit according to claim 1, wherein the mixer circuit is of a Gilbert cell type.

5. A semiconductor integrated circuit comprising:
   a mixer circuit having an upper-stage transistor circuit to which a signal serving as a reference for frequency conversion is inputted and a lower-stage transistor circuit to which another signal to be converted is inputted, wherein a first resistance and a second resistance serving as a load are connected between said upper-stage transistor circuit and supply voltage, and a result of operation on said two signals performed via said upper-stage transistor circuit and said lower-stage transistor circuit is made to appear as a first signal and a second signal at said first resistance and said second resistance respectively on the basis of said supply voltage;
   an emitter follower circuit including a first transistor and a second transistor for respectively receiving the first signal and the second signal outputted from the mixer circuit and outputting a first amplified signal and a second amplified signal that have been subjected to impedance conversion on the basis of said supply voltage; and
   a single output type operational amplifier circuit for receiving said first amplified signal on an inverting input side via an input resistance and said second amplified signal on a non-inverting input side and amplifying the signals to output a result, the operational amplifier circuit including a feedback resistance for connecting its output side and the inverting input side provided with said input resistance.

6. A semiconductor integrated circuit according to claim 5, wherein each of output sides of the first transistor and the second transistor included in the emitter follower circuit is provided with a resistance for adjustment of output voltage.

7. A semiconductor integrated circuit according to claim 5, wherein a tap resistance for adjustment of output voltage is provided between the first and second resistances and the supply voltage.

8. A semiconductor integrated circuit according to claim 5, wherein the lower-stage transistor circuit is formed by two transistors whose sizes are made variable.

9. A semiconductor integrated circuit according to claim 5, wherein a capacitance is connected between the first resistance and the second resistance on the side of the upper-stage transistor circuit.

10. A semiconductor integrated circuit according to claim 5, wherein the mixer circuit is of a Gilbert cell type.

* * * * *